(12) United States Patent
Fang et al.

(10) Patent No.: US 9,842,774 B1
(45) Date of Patent: Dec. 12, 2017

(54) THROUGH SUBSTRATE VIA STRUCTURE FOR NOISE REDUCTION

(71) Applicant: TAIWAN SEMICONDUCTOR MANUFACTURING CO., LTD., Hsinchu (TW)

(72) Inventors: Chun-Lin Fang, Tainan (TW); Ping-Hao Lin, Tainan (TW); Ching-Hua Chu, Kaohsiung (TW); Hsiao-Chun Lee, Chiayi (TW); Chi-Feng Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/180,276

(22) Filed: Jun. 13, 2016

(51) Int. Cl.
| | |
|---|---|
| *H01L 29/40* | (2006.01) |
| *H01L 21/768* | (2006.01) |
| *H01L 23/48* | (2006.01) |
| *H01L 23/485* | (2006.01) |
| *H01L 21/285* | (2006.01) |
| *H01L 21/02* | (2006.01) |
| *H01L 23/522* | (2006.01) |
| *H01L 23/528* | (2006.01) |

(52) U.S. Cl.
CPC .... *H01L 21/76898* (2013.01); *H01L 21/0228* (2013.01); *H01L 21/02164* (2013.01); *H01L 21/02271* (2013.01); *H01L 21/2855* (2013.01); *H01L 21/76831* (2013.01); *H01L 21/76843* (2013.01); *H01L 23/481* (2013.01); *H01L 23/485* (2013.01); *H01L 23/5225* (2013.01); *H01L 23/5286* (2013.01)

(58) Field of Classification Search
CPC ............. H01L 21/486; H01L 21/76898; H01L 2225/06541; H01L 23/481; H01L 23/5384
USPC ........................................................ 257/621
See application file for complete search history.

(56) References Cited

U.S. PATENT DOCUMENTS

| | | | | |
|---|---|---|---|---|
| 2006/0001174 A1* | 1/2006 | Matsui | ............. | H01L 21/76898 257/774 |
| 2013/0320538 A1* | 12/2013 | Jindal | ............... | H01L 21/76898 257/751 |
| 2014/0054774 A1* | 2/2014 | Uchida | ................. | H01L 23/481 257/751 |
| 2015/0137387 A1* | 5/2015 | Choi | ..................... | H01L 23/481 257/774 |

OTHER PUBLICATIONS

Machine translation of JP2002-043502.*

* cited by examiner

*Primary Examiner* — Sonya D McCall Shepard
(74) *Attorney, Agent, or Firm* — McClure, Qualey & Rodack, LLP

(57) ABSTRACT

A semiconductor device includes a substrate and a through substrate via structure. The substrate has a through via hole. The through substrate via structure is disposed in the through via hole. The through substrate via structure disposed in the through via hole includes a liner structure and a metal layer. The liner structure includes at least two insulation liners and at least one conductive shielding layer disposed between the insulation liners, in which the insulation liners and the at least one conductive shielding layer conformally cover a sidewall and a bottom of the through via hole. The metal layer covers the liner structure and fills the through via hole.

20 Claims, 11 Drawing Sheets

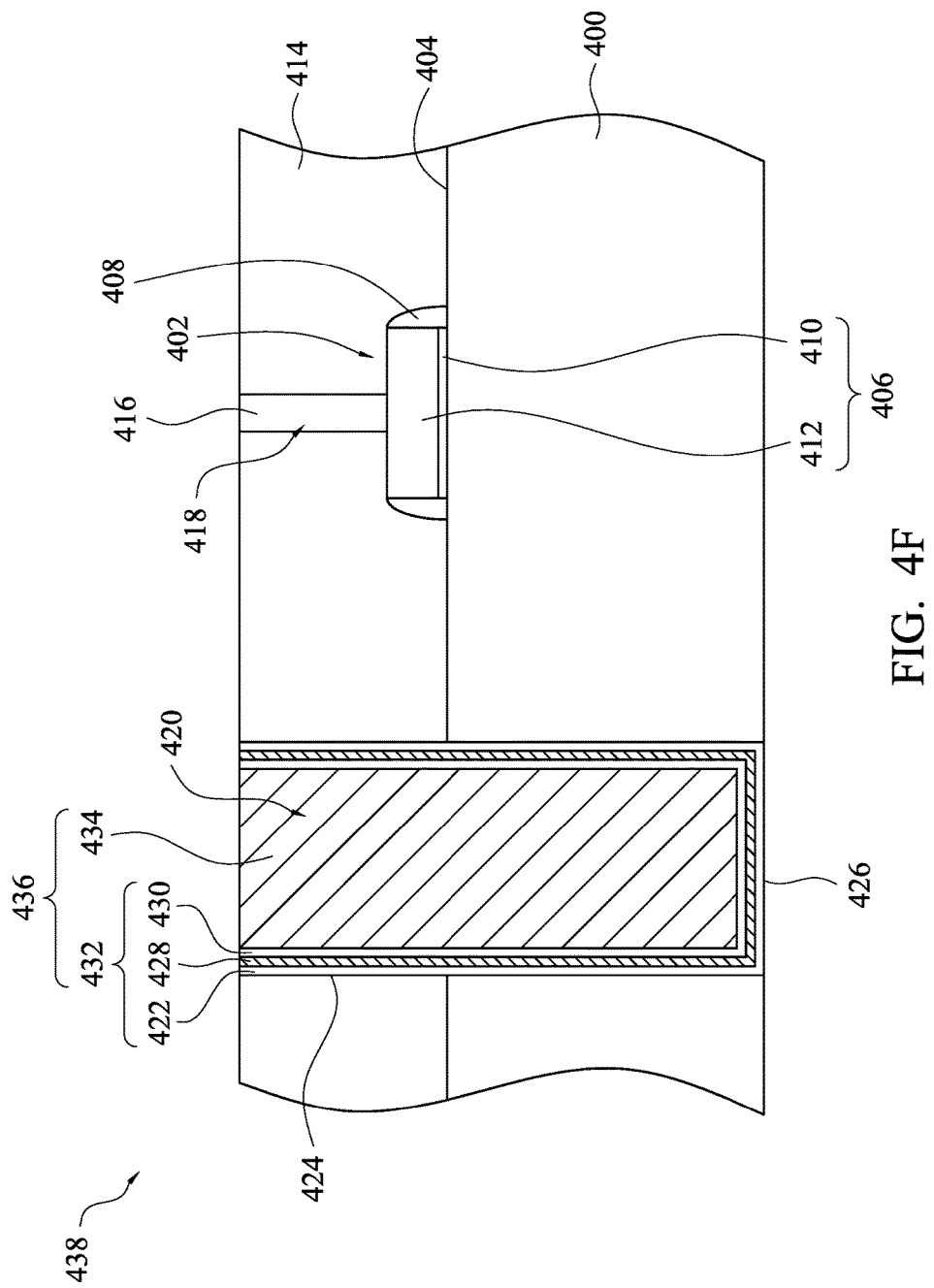

THROUGH SUBSTRATE VIA STRUCTURE FOR NOISE REDUCTION

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of a three-dimensional (3D) vertical integration technique. As the development of the three-dimensional vertical integration technique is proceeding, complex metal routing is needed, and various interlayer connecting structures, such as contacts, through vias and through substrate vias (TSVs), are used to connect devices. However, conventional interlayer connecting structures and methods of fabricating the interlayer connecting structures have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A through FIG. 4G are schematic cross-sectional views of intermediate stages showing a method for manufacturing a semiconductor device in accordance with various embodiments.

DETAILED DESCRIPTION

Figure 1:
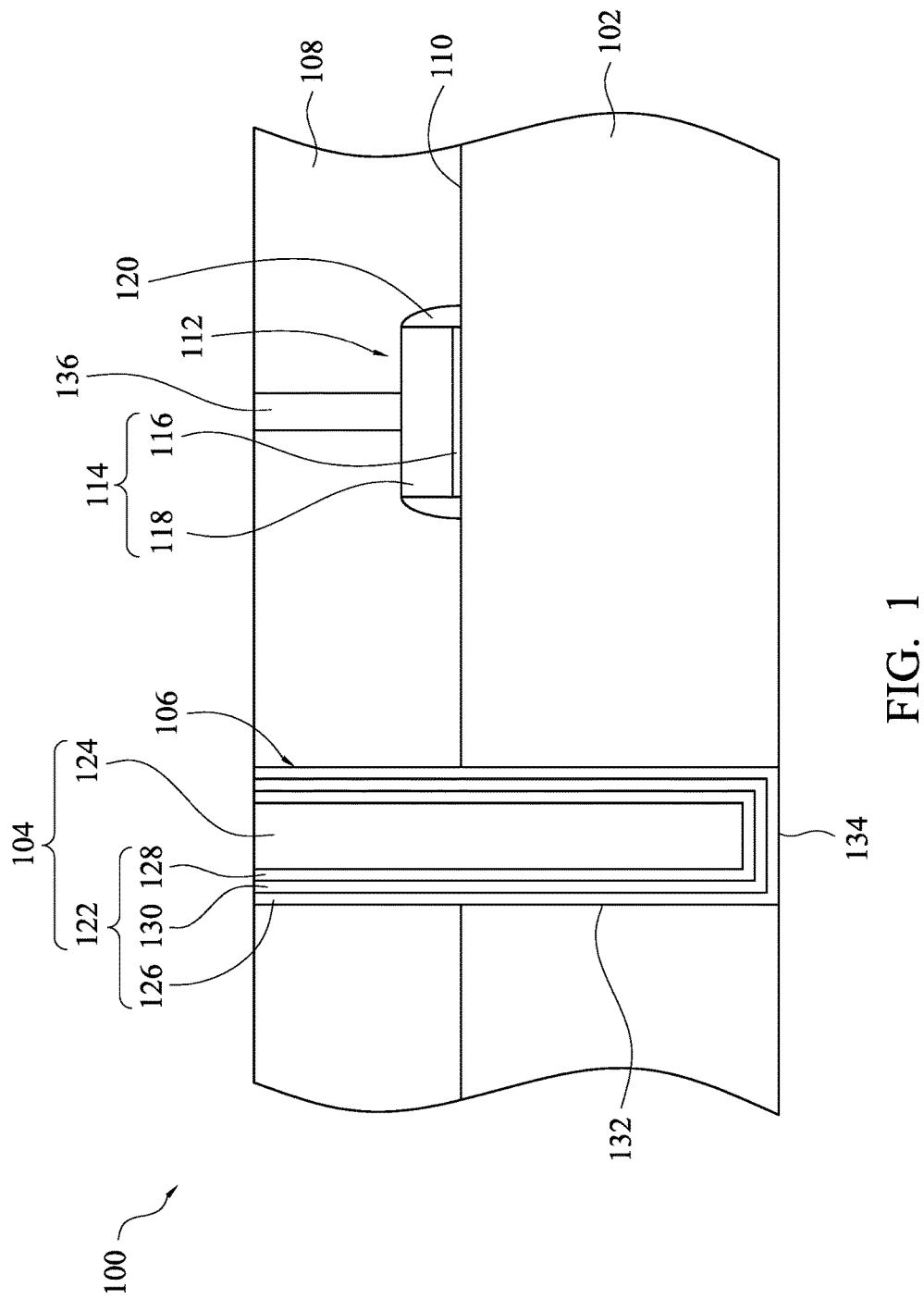
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

A typical through substrate via includes a metal core and an isolation liner. The isolation liner covers a side surface and a bottom of the metal core for preventing current leakage from the through substrate via to adjacent through substrate vias or to adjacent devices. As semiconductor integrated circuits are increasingly shrunk, a pitch of the through substrate vias and a distance between the through substrate via and the adjacent device are getting shorter and shorter, thus the influences of noises between the through substrate vias and between the through via and the device are more and more significant and cannot be ignored. However, the isolation liner of the typical through substrate via only can prevent current leakage, and cannot eliminate the influences of the noises between the through substrate vias and between the through vias and the device. Accordingly, the pitch of the through substrate vias and the distance between the through substrate via and the device cannot be further scaled down due to the concern of the noise.

Embodiments of the present disclosure are directed to providing a semiconductor device and a method for manufacturing the semiconductor device, in which a through substrate via structure includes a metal layer and a liner structure which conformally covers a side surface and a bottom of the metal layer and includes at least two insulation liners and at least one conductive shielding layer sandwiched between the insulation liners, such that noises between the through substrate via structure and an adjacent through substrate via and between the through substrate via structure and an adjacent device can be significantly reduced. Accordingly, a pitch of the through substrate vias and a distance between the through substrate via and the device can be shrunk.

FIG. 1 is a schematic cross-sectional view of a semiconductor device in accordance with various embodiments. In some embodiments, as shown in FIG. 1, the semiconductor device 100 includes a substrate 102 and a through substrate via structure 104. The substrate 102 may be a semiconductor substrate. The substrate 102 may be composed of a single-crystalline semiconductor material or a compound semiconductor material. For example, silicon or germanium may be used as a material forming the substrate 102. In some exemplary examples, the substrate 102 is composed of silicon. The substrate 102 has one or more through via hole 106, which passes through the substrate 102. For example, an aspect ratio of the through via hole 106, which is a ratio of a depth of the through via hole 106 to a width of the through via hole 106, may range from about 8 to about 9.

In some examples, the semiconductor device 100 may optionally include an interlayer dielectric layer 108. The interlayer dielectric layer 108 is disposed on a surface 110 of the substrate 102. For example, the interlayer dielectric layer 108 may be formed from silicon nitride, silicon carbide, silicon oxide, a low dielectric constant dielectric material, or combinations thereof. In the examples, the through via hole 106 extends from the interlayer dielectric layer 108 to the substrate 102, and passes through the interlayer dielectric layer 108 and the substrate 102.

In some examples, the semiconductor device 100 may optionally include at least one device 112. The device 112 is disposed on the surface 110 of the substrate 102, and is covered by the interlayer dielectric layer 108. In some exemplary examples, the device 112 is adjacent to the through via hole 106. The device 112 may be an active device or a passive device. For example, the device 112 may include a gate structure 114 and a spacer 120, which is disposed on a sidewall of the gate structure 114. The gate structure 114 may include a gate dielectric layer 116 and a gate electrode 118, in which the gate dielectric layer 116 is disposed on the surface 110 of the substrate 102, and the gate electrode 118 is disposed on the gate dielectric layer 116. For example, the gate dielectric layer 116 may be formed from silicon oxide, and the gate electrode 118 may be formed from metal or polysilicon. The spacer 408 is formed on a sidewall of the gate structure 406. The semiconductor device 100 may optionally include a contact 136. The contact 136 is formed in the interlayer dielectric layer 108, and extends from a top of the interlayer dielectric layer 108 to a top of the gate structure 114 to contact with the gate electrode 118, such that the contact 136 can electrically connect the gate structure 114 to other devices or interconnection layers.

The through substrate via structure 104 is disposed in the through via hole 106 of the substrate 102 and fills the through via hole 106. The through substrate via structure 104 may be adjacent to the device 112. In some examples, the through substrate via structure 104 includes a liner structure 122 and a metal layer 124. The liner structure 122 includes at least two insulation liners and at least one conductive shielding layer disposed between the insulation liners. For example, as shown in FIG. 1, the liner structure 122 includes two insulation liners 126 and 128, and one conductive shielding layer 130, in which the conductive shielding layer 130 is disposed between the insulation liners 126 and 128. In some exemplary examples, the insulation liner 126 conformally covers a sidewall 132 and a bottom 134 of the through via hole 106, the conductive shielding layer 130 is disposed on the insulation liner 126 and conformally covers the sidewall 132 and the bottom 134 of the through via hole 106, and the insulation liner 128 is disposed on the conductive shielding layer 130 and conformally covers the sidewall 132 and the bottom 134 of the through via hole 106. For example, the insulation liners 126 and 128 may be formed from silicon oxide. In addition, the conductive shielding layer 130 may be formed from titanium nitride or tantalum nitride.

As shown in FIG. 1, the metal layer 124 is disposed on and covers the insulation liner 128 of the liner structure 122, and fills the through via hole 106. For example, the metal layer 124 may be formed from copper. In the through substrate via structure 104, the conductive shielding layer 130 is separated from the metal layer 124 by the insulation liner 128, such that the conductive shielding layer 130 is electrically isolated from the metal layer 124.

With the conductive shielding layer 130, the metal layer 124 can be shielded from electromagnetic waves generated by adjacent vias, contacts and/or devices, thereby effectively reducing noise in the through substrate via structure 104. Furthermore, the noise caused by the adjacent vias, contacts and/or devices can be reduced, such that distances between through substrate via structures 104 and the adjacent vias, contacts and/or devices can be shrunk.

Figure 2:
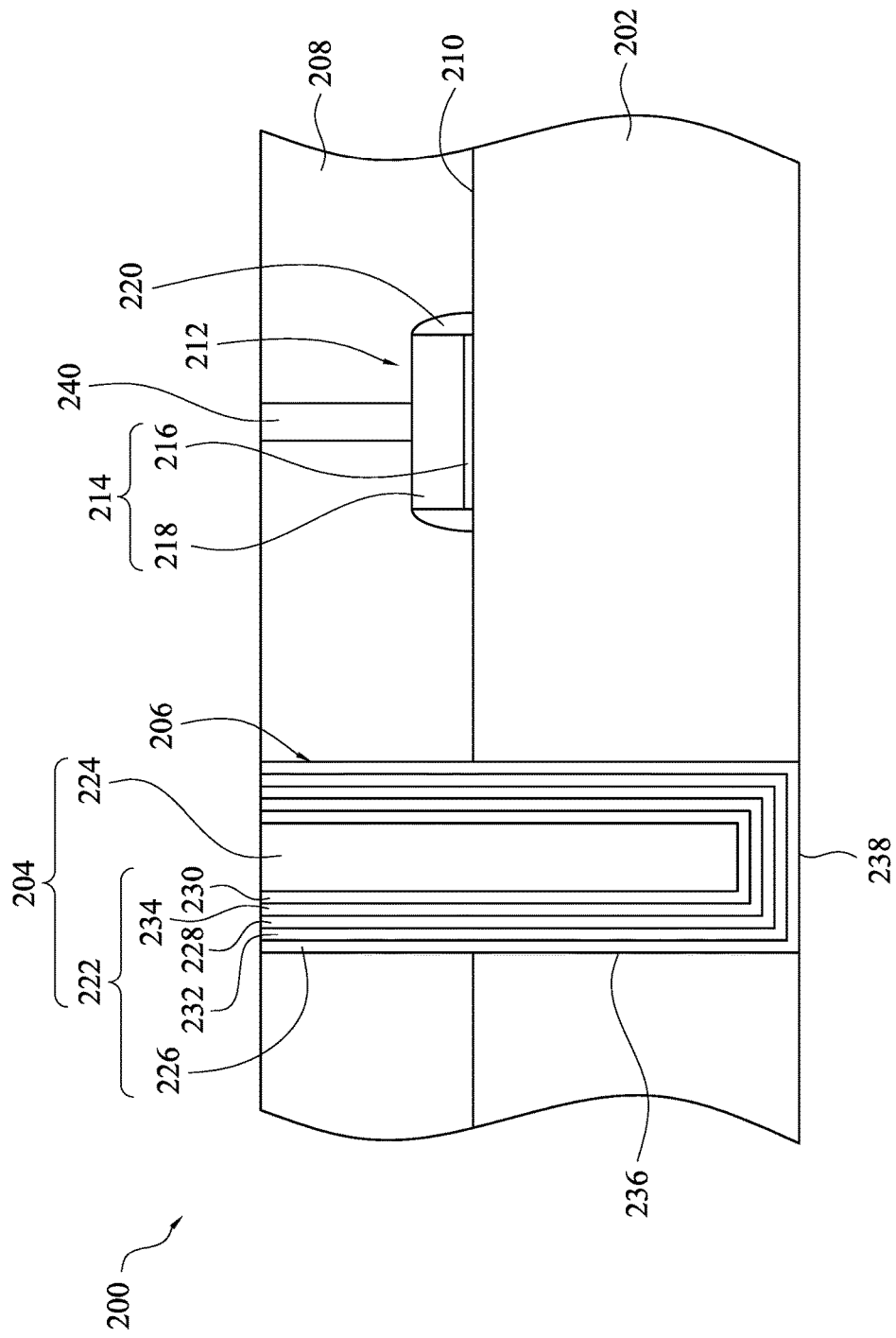
FIG. 2 is a schematic cross-sectional view of a semiconductor device in accordance with various embodiments.

FIG. 2 is a schematic cross-sectional view of a semiconductor device in accordance with various embodiments. In some embodiments, as shown in FIG. 2, the semiconductor device 200 includes a substrate 202 and a through substrate via structure 204. The substrate 202 may be a semiconductor substrate. The substrate 202 may be composed of a single-crystalline semiconductor material or a compound semiconductor material. For example, silicon or germanium may be used as a material forming the substrate 202. The substrate 202 has one or more through via hole 206, which passes through the substrate 202. For example, an aspect ratio of the through via hole 206, which is a ratio of a depth of the through via hole 206 to a width of the through via hole 206, may range from about 8 to about 9.

In some examples, the semiconductor device 200 may optionally include at least one device 212. The device 212 is disposed on a surface 210 of the substrate 202. In some exemplary examples, the device 212 may be an active device or a passive device. For example, the device 112 may include a gate structure 214 and a spacer 220, which is disposed on a sidewall of the gate structure 214. The gate structure 214 may include a gate dielectric layer 216 and a gate electrode 218, in which the gate dielectric layer 216 is disposed on the surface 210 of the substrate 202, and the gate electrode 218 is disposed on the gate dielectric layer 216. For example, the gate dielectric layer 216 may be formed from silicon oxide, and the gate electrode 218 may be formed from metal or polysilicon.

In some examples, the semiconductor device 200 may optionally include an interlayer dielectric layer 208. The interlayer dielectric layer 208 is disposed on the surface 210 of the substrate 202 and covers the device 212. For example, the interlayer dielectric layer 208 may be formed from silicon nitride, silicon carbide, silicon oxide, a low dielectric constant dielectric material, or combinations thereof. In the examples, the through via hole 206 passes through the interlayer dielectric layer 208 and the substrate 202. The semiconductor device 200 may optionally include a contact 240. The contact 240 is formed in the interlayer dielectric layer 208, and extends from a top of the interlayer dielectric layer 208 to a top of the gate structure 214 to contact with the gate electrode 218, such that the contact 240 can electrically connect the gate structure 214 to other devices or interconnection layers.

The through substrate via structure 204 is disposed in the through via hole 206 of the substrate 202 and fills the through via hole 206. The through substrate via structure 204 may be adjacent to the device 212. In some examples, the through substrate via structure 204 includes a liner structure 222 and a metal layer 224. The liner structure 222 includes three insulation liners 226, 228 and 230, and two conductive shielding layers 232 and 234, which are respectively disposed between the insulation liners 226 and 228 and the insulation liners 228 and 230. In some exemplary examples, the insulation liner 226 is disposed on and covers a sidewall 236 and a bottom 238 of the through via hole 206, the conductive shielding layer 232 is disposed on the insulation liner 226, the insulation liner 228 is disposed on the conductive shielding layer 232, the conductive shielding layer 234 is disposed on the insulation liner 228, and the insulation liner 230 is disposed on the conductive shielding layer 234. The conductive shielding layers 232 and 234 are separated from each other by the insulation liner 228. In addition, each of the insulation liners 226, 228 and 230, and the conductive shielding layers 232 and 234 conformally covers the sidewall 236 and the bottom 238 of the through via hole 206. For example, the insulation liners 226, 228 and 230 may be formed from silicon oxide. In addition, the conductive shielding layer 232 and 234 may be formed from titanium nitride or tantalum nitride.

As shown in FIG. 2, the metal layer 224 is disposed on and covers the insulation liner 230 of the liner structure 222, and fills the through via hole 206. For example, the metal layer 224 may be formed from copper. In the through substrate via structure 204, the conductive shielding layer 234 is separated from the metal layer 224 by the insulation liner 230, such that the conductive shielding layer 234 is electrically isolated from the metal layer 224.

In the present embodiment, a number of the insulation liners is greater than a number of the conductive shielding layers by one, and each of the conductive shielding layers is disposed between adjacent two of the insulation liners.

Figure 3:
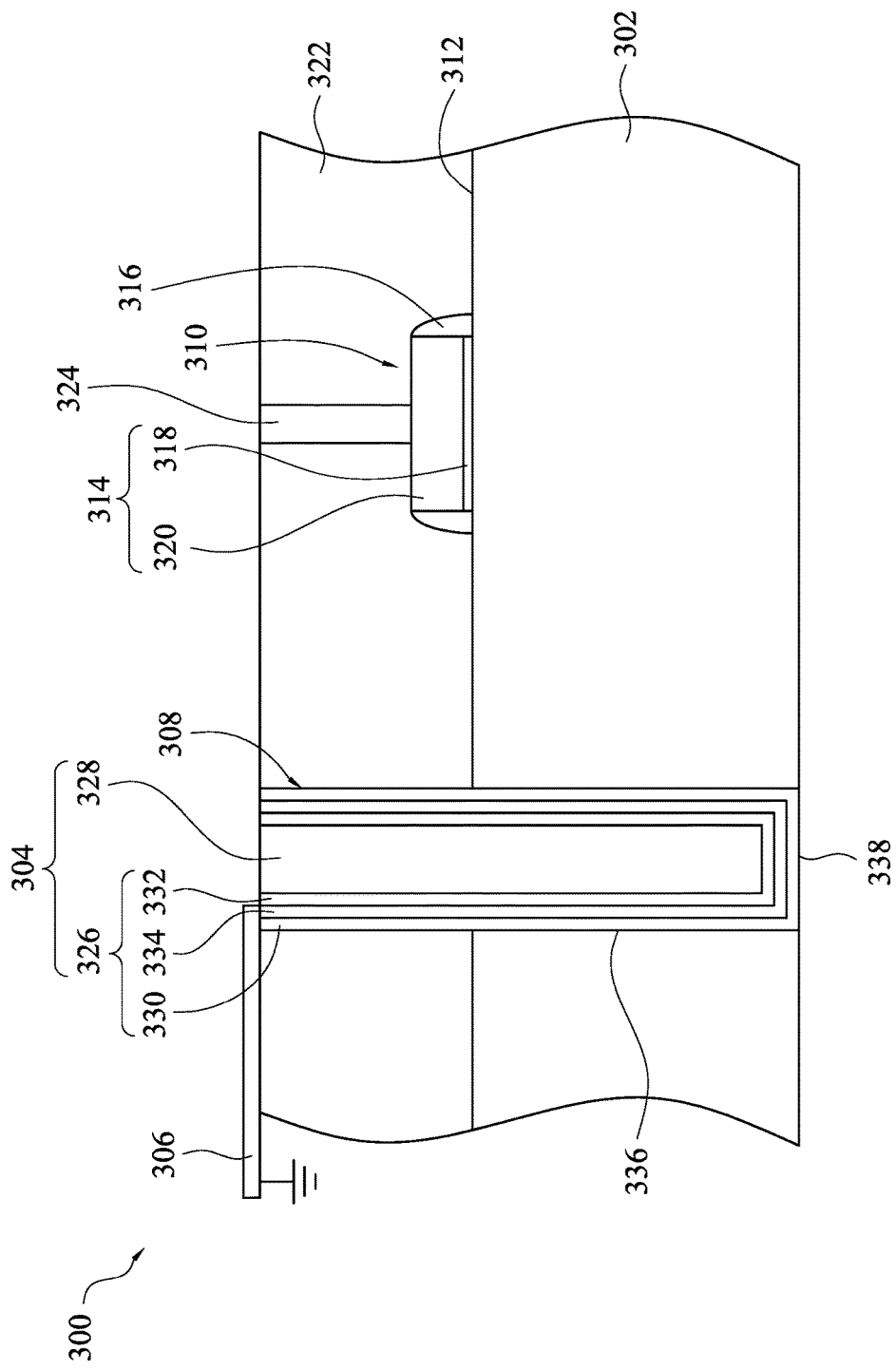
FIG. 3 is a schematic cross-sectional view of a semiconductor device in accordance with various embodiments.

FIG. 3 is a schematic cross-sectional view of a semiconductor device in accordance with various embodiments. In some embodiments, as shown in FIG. 3, the semiconductor device 300 includes a substrate 302, a through substrate via structure 304 and a grounding layer 306. The substrate 302 may be a semiconductor substrate. The substrate 302 may be composed of a single-crystalline semiconductor material or a compound semiconductor material. For example, silicon or germanium may be used as a material forming the substrate 302. The substrate 302 has one or more through via hole 308, which passes through the substrate 302. In some exemplary examples, an aspect ratio of the through via hole 308, which is a ratio of a depth of the through via hole 308 to a width of the through via hole 308, may range from about 8 to about 9.

In some examples, the semiconductor device 300 may optionally include at least one device 310. The device 310 is disposed on a surface 312 of the substrate 302. In some exemplary examples, the device 310 may be an active device or a passive device. For example, the device 310 may include a gate structure 314 and a spacer 316, which is disposed on a sidewall of the gate structure 314. The gate structure 314 may include a gate dielectric layer 318 and a gate electrode 320, in which the gate dielectric layer 318 is disposed on the surface 312 of the substrate 302, and the gate electrode 320 is disposed on the gate dielectric layer 318. For example, the gate dielectric layer 318 may be formed from silicon oxide, and the gate electrode 320 may be formed from metal or polysilicon.

In some examples, the semiconductor device 300 may optionally include an interlayer dielectric layer 322. The interlayer dielectric layer 322 is disposed on the surface 312 of the substrate 302 and covers the device 310. For example, the interlayer dielectric layer 322 may be formed from silicon nitride, silicon carbide, silicon oxide, a low dielectric constant dielectric material, or combinations thereof. In the examples, the through via hole 308 passes through the interlayer dielectric layer 322 and the substrate 302. The semiconductor device 300 may optionally include a contact 324. The contact 324 is formed in the interlayer dielectric layer 322, and extends from a top of the interlayer dielectric layer 322 to a top of the gate structure 314 to contact with the gate electrode 320, such that the contact 324 can electrically connect the gate structure 314 to other devices or interconnection layers.

The through substrate via structure 304 is disposed in the through via hole 308 of the substrate 302 and fills the through via hole 308. The through substrate via structure 304 may be adjacent to the device 310. In some examples, the through substrate via structure 304 includes a liner structure 326 and a metal layer 328. The liner structure 326 includes at least two insulation liners and at least one conductive shielding layer disposed between the insulation liners. For example, as shown in FIG. 3, the liner structure 326 includes two insulation liners 330 and 332, and one conductive shielding layer 334, in which the conductive shielding layer 334 is disposed between the insulation liners 330 and 332. In some exemplary examples, the insulation liner 330 covers a sidewall 336 and a bottom 338 of the through via hole 308, the conductive shielding layer 334 is disposed on the insulation liner 330, and the insulation liner 332 is disposed on the conductive shielding layer 334. For example, each of the insulation liners 330 and 332, and the conductive shielding layer 334 conformally covers the sidewall 336 and the bottom 338 of the through via hole 308. In some exemplary examples, the insulation liners 330 and 332 may be formed from silicon oxide. In addition, the conductive shielding layer 334 may be formed from titanium nitride or tantalum nitride.

As shown in FIG. 3, the metal layer 328 is disposed on and covers the insulation liner 332 of the liner structure 326, and fills the through via hole 308. For example, the metal layer 328 may be formed from copper. In the through substrate via structure 304, the conductive shielding layer 334 is separated from the metal layer 328 by the insulation liner 332, such that the conductive shielding layer 334 is electrically isolated from the metal layer 328.

One end of the grounding layer 306 is connected to the conductive shielding layer 334, and the other end of the grounding layer 306 is connected to the ground, such that the grounding layer 306 connects the conductive shielding layer 334 to the ground. In some examples, as shown in FIG. 3, the grounding layer 306 is disposed on the interlayer dielectric layer 322 and the conductive shielding layer 334. In addition, the grounding layer 306 is not connected to the metal layer 328. For example, the grounding layer 306 may be formed from metal.

With the conductive shielding layer 334, the metal layer 328 can be shielded from electromagnetic waves generated by adjacent vias, contacts and/or devices, thereby effectively reducing noise in the through substrate via structure 304. Furthermore, the noise caused by the adjacent vias, contacts and/or devices can be reduced, such that distances between through substrate via structures 304 and the adjacent vias, contacts and/or devices can be shrunk. Moreover, the grounding layer 306 can connect the conductive shielding layer 334 to the ground, such that a voltage of the conductive shielding layer 334 is zero, thereby preventing the voltage of the conductive shielding layer 334 from floating. Thus, it can prevent the conductive shielding layer 334 from interfering with the transmission of signals in the through substrate via structure 304.

In some examples, the semiconductor device 300 may include a plurality of conductive shielding layers, a number of the insulation liners is greater than a number of the conductive shielding layers by one, and each of the conductive shielding layers is disposed between adjacent two of the insulation liners.

Figure 4A:
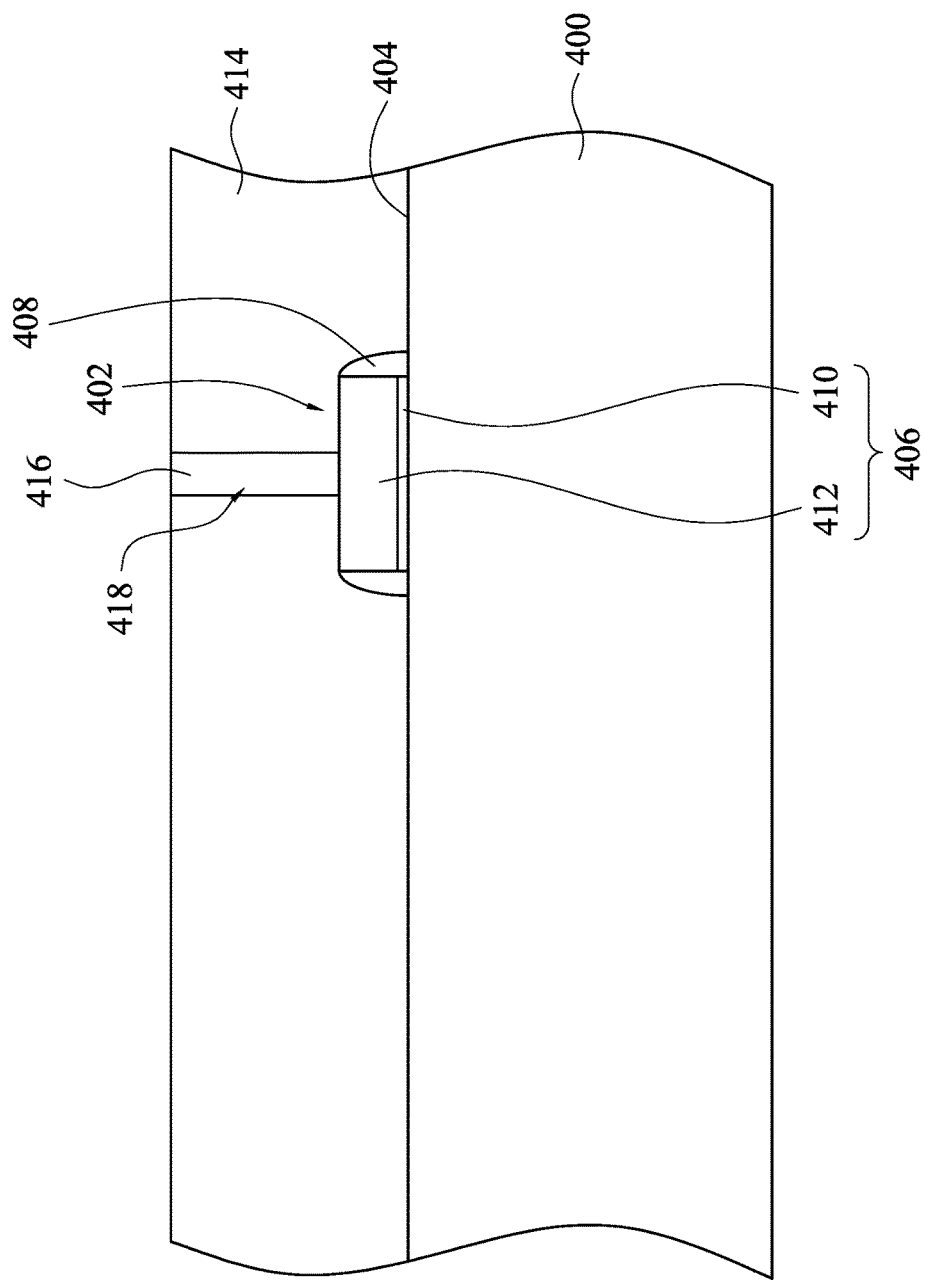

FIG. 4A through FIG. 4G are schematic cross-sectional views of intermediate stages showing a method for manufacturing a semiconductor device in accordance with various embodiments. As shown in FIG. 4A, a substrate 400 is provided. The substrate 400 may be a semiconductor substrate. The substrate 400 may be composed of a single-crystalline semiconductor material or a compound semiconductor material. In some exemplary examples, silicon or germanium is used as a material forming the substrate 400.

In some examples, referring to FIG. 4A again, at least one device 402 may be optionally formed on a surface 404 of the substrate 400. The device 402 may be an active device or a passive device. For example, the device 402 may be formed to include a gate structure 406 and a spacer 408. In the formation of the gate structure 406, a gate dielectric layer 410 is formed on the surface 404 of the substrate 400, and a gate electrode 412 is formed on the gate dielectric layer 410. For example, the gate dielectric layer 410 may be formed from silicon oxide, and the gate electrode 412 may be formed from metal or polysilicon. The spacer 408 is formed on a sidewall of the gate structure 406.

In some examples, after the device 402 is completed, an interlayer dielectric layer 414 is optionally formed to cover the device 402 and the surface 404 of the substrate 400. For example, the interlayer dielectric layer 414 may be formed from silicon nitride, silicon carbide, silicon oxide, a low dielectric constant dielectric material, or combinations thereof. In some exemplary examples, a planarization process may be performed on the interlayer dielectric layer 414 to form the interlayer dielectric layer 414 having a planar top surface. The planarization process may be performed by using a chemical mechanical polishing (CMP) technique.

After the formation of the interlayer dielectric layer 414 is completed, a contact 416 may be formed in the interlayer dielectric layer 414. In some exemplary examples, the formation of the contact 416 includes removing a portion of the interlayer dielectric layer 414 to form a contact hole 418 in the interlayer dielectric layer 414. The contact hole 418 may be formed by using a photolithography process and an etching process. The contact hole 418 is formed to expose a portion of the gate electrode 412 of the device 402. The formation of the contact 416 further includes forming the contact 416 to fill the contact hole 418 in the interlayer dielectric layer 414 by, for example, a deposition technique or an electrochemical plating (ECP) technique. The contact hole 418 exposes the portion of the gate electrode 412, such that the contact 416, which fills the contact hole 418, extends from a top of the interlayer dielectric layer 414 to a top of the gate electrode 412 and contacts the portion of the gate electrode 412. Thus, the contact 416 can electrically connect the gate electrode 412 to other devices or interconnection layers.

Figure 4B:
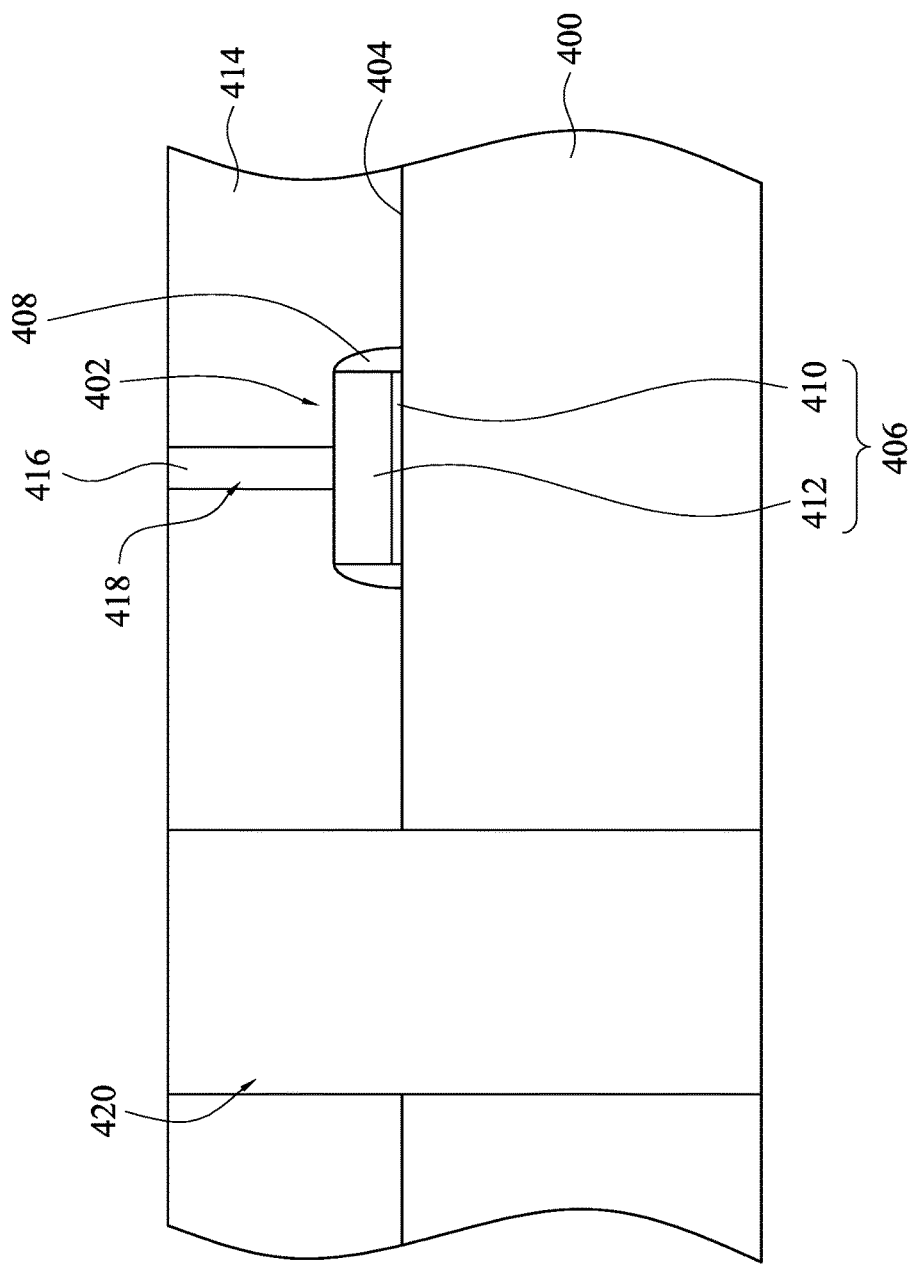

In some examples, a through via hole 420 is formed in the substrate 400 and passes through the substrate 400 by using, for example, a photolithography technique and an etching technique. In some exemplary examples, as shown in FIG. 4B, the through via hole 420 is formed in the interlayer dielectric layer 414 and the substrate 400, and the through via hole 420 extends from a top of the interlayer dielectric layer 414 to a bottom of the substrate 400 to pass through the interlayer dielectric layer 414 and the substrate 400. For example, the through via hole 420 may be formed to have an aspect ratio, which is a ratio of a depth of the through via hole 420 to a width of the through via hole 420, ranging from about 8 to about 9. The through via hole 420 may be adjacent to the device 402.

Referring to FIG. 4C through FIG. 4F, a through substrate via structure 436 as shown in FIG. 4F is formed to fill the through via hole 420. In some exemplary examples, the through via hole 420 passes through the interlayer dielectric layer 414 and the substrate 400, so that the through substrate via structure 436 filling the through via hole 420 passes through the interlayer dielectric layer 414 and the substrate 400. As shown in FIG. 4F, forming the through substrate via structure 436 includes forming a liner structure 432 to cover a sidewall 424 and a bottom 426 of the through via hole 420, and forming a metal layer 434 to cover the liner structure 432 and to fill the through via hole 420.

The liner structure 432 may be formed to include at least two insulation liners and at least one conductive shielding layer disposed between the insulation liners. For example, as shown in FIG. 4E, the liner structure 432 is formed to include a first insulation liner 422, a second insulation liner 430 and a conductive shielding layer 428, and the conductive shielding layer 428 is disposed between the first insulation liner 422 and the second insulation liner 430. In some certain examples, a liner structure may be formed to include conductive shielding layers and insulation liners, in which a number of the insulation liners is greater than a number of the conductive shielding layers by one, and each of the conductive shielding layers is disposed between adjacent two of the insulation liners.

Figure 4C:
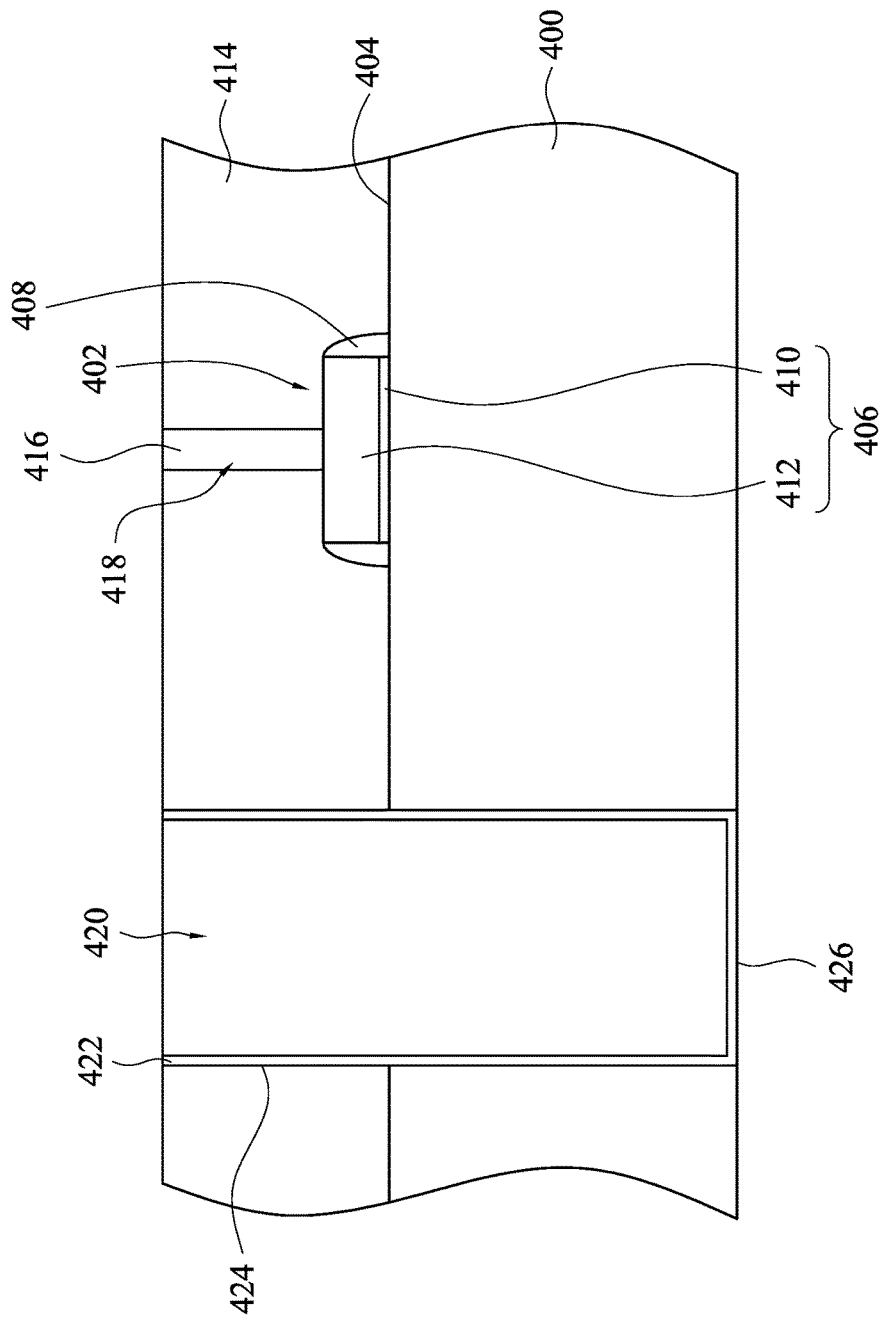

Referring to FIG. 4C and FIG. 4F, in the formation of the liner structure 432, the first insulation liner 422 is formed to cover the sidewall 424 and the bottom 426 of the through via hole 420. In some exemplary examples, the first insulation liner 422 conformally covers the sidewall 424 and the bottom 426 of the through via hole 420. The through via hole 420 has a high aspect ratio, such that the first insulation liner 422 may be formed by using an atomic layer deposition (ALD) technique or a chemical vapor deposition (CVD) technique, such as a plasma-enhanced chemical vapor deposition (PECVD) technique. For example, the first insulation liner 422 may be formed from silicon oxide.

Figure 4D:
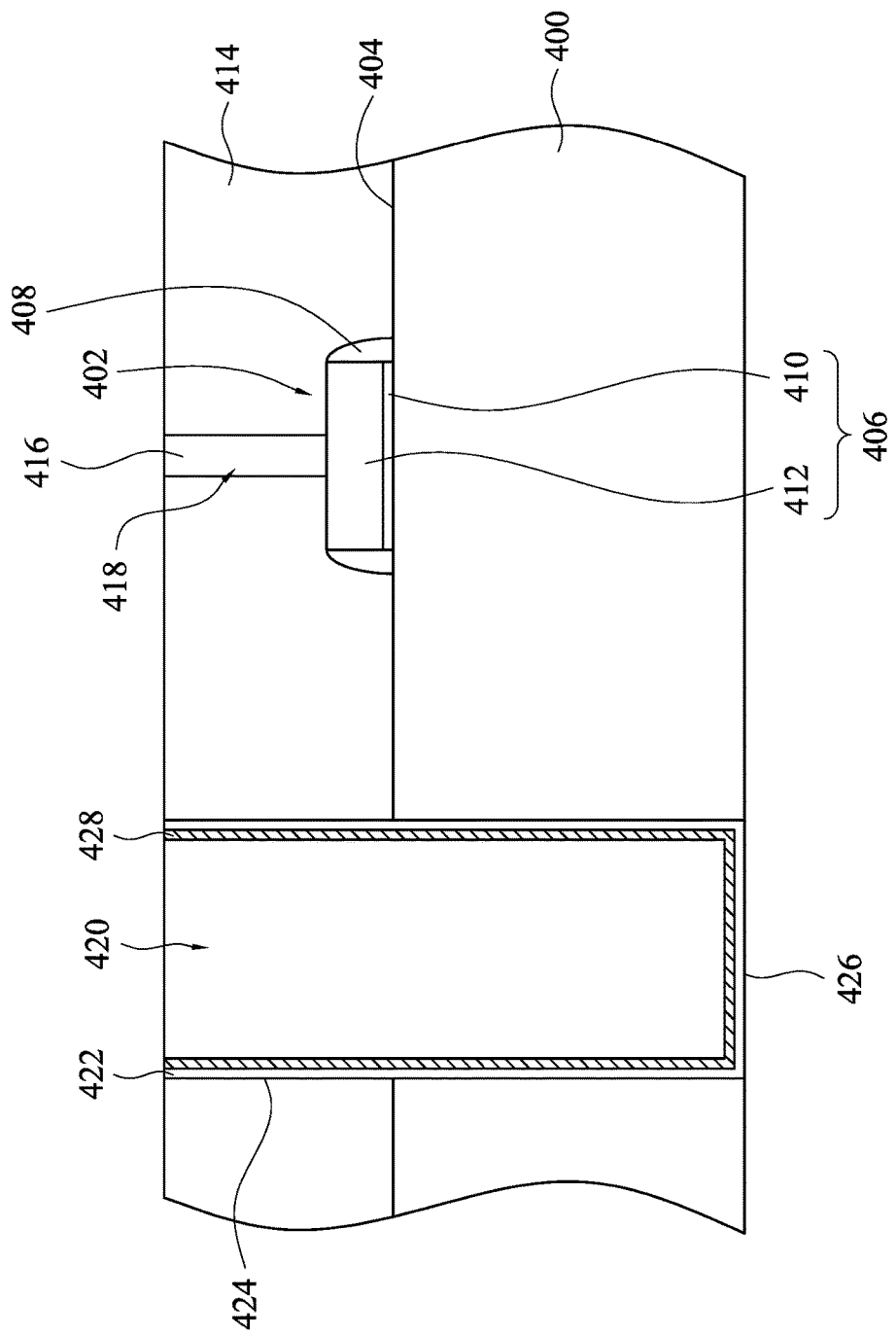
Figure 4E:
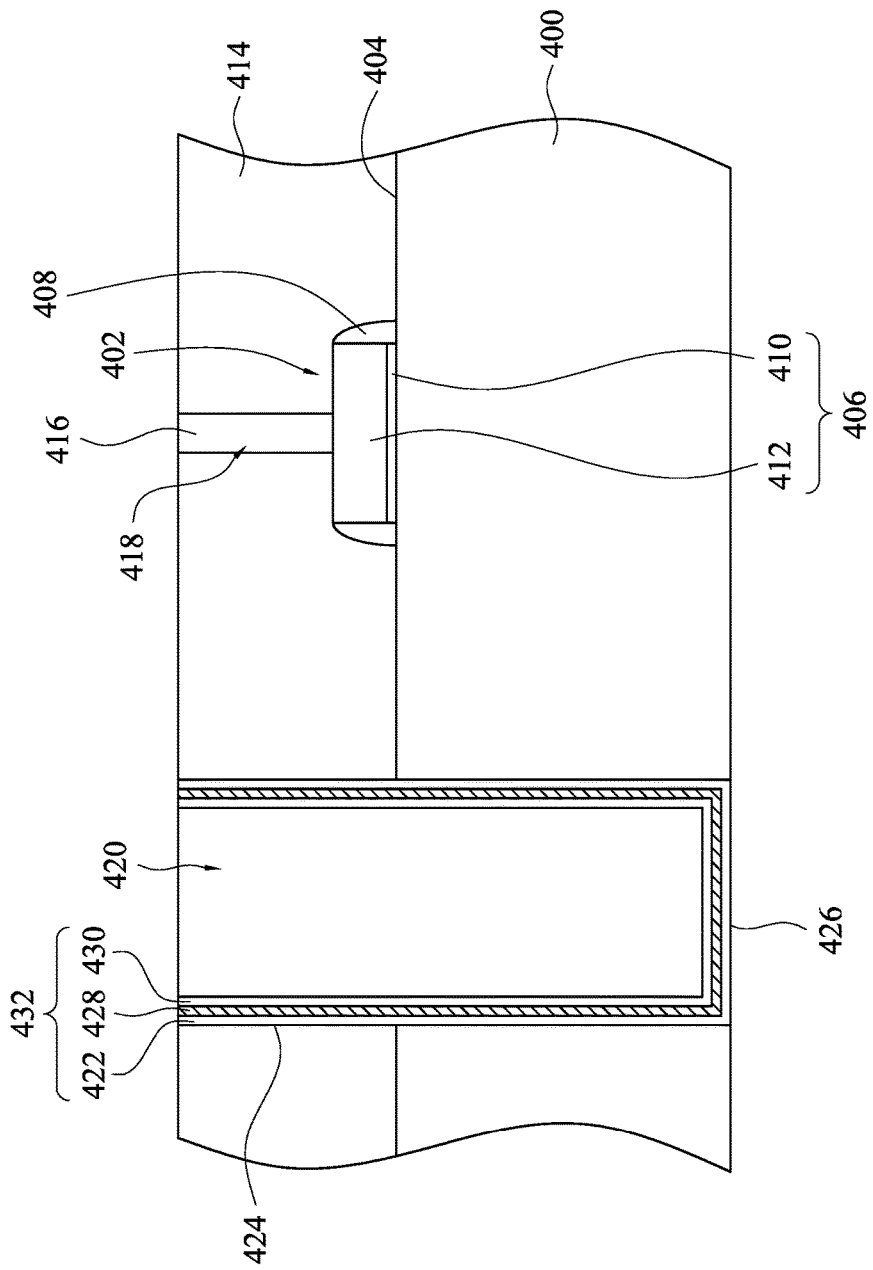

As shown in FIG. 4D, after the first insulation liner 422 is completed, the conductive shielding layer 428 is formed on the first insulation liner 422. The conductive shielding layer 428 is formed to cover the sidewall 424 and the bottom 426 of the through via hole 420. In some exemplary examples, the conductive shielding layer 428 conformally covers the sidewall 424 and the bottom 426 of the through via hole 420. The through via hole 420 has a high aspect ratio, such that the conductive shielding layer 428 may be formed by using a sputtering technique. For example, the conductive shielding layer 428 may be formed from titanium nitride or tantalum nitride.

As shown in FIG. 4E, the second insulation liner 430 is formed on the conductive shielding layer 428 to complete the liner structure 432. The second insulation liner 430 is formed to cover the sidewall 424 and the bottom 426 of the through via hole 420. In some exemplary examples, the second insulation liner 430 conformally covers the sidewall 424 and the bottom 426 of the through via hole 420. The second insulation liner 430 may be formed by using an atomic layer deposition technique or a chemical vapor deposition technique, such as a plasma-enhanced chemical vapor deposition technique. For example, the second insulation liner 430 may be formed from silicon oxide.

As shown in FIG. 4F, the metal layer 434 is formed on the liner structure 432 to complete the through substrate via structure 436, so as to substantially a semiconductor device 438. The metal layer 434 is formed to cover the liner structure 432 and to fill the through via hole 420. The metal layer 434 may be formed by using an electrochemical plating technique. For example, the metal layer 434 may be formed from copper.

Figure 4G:
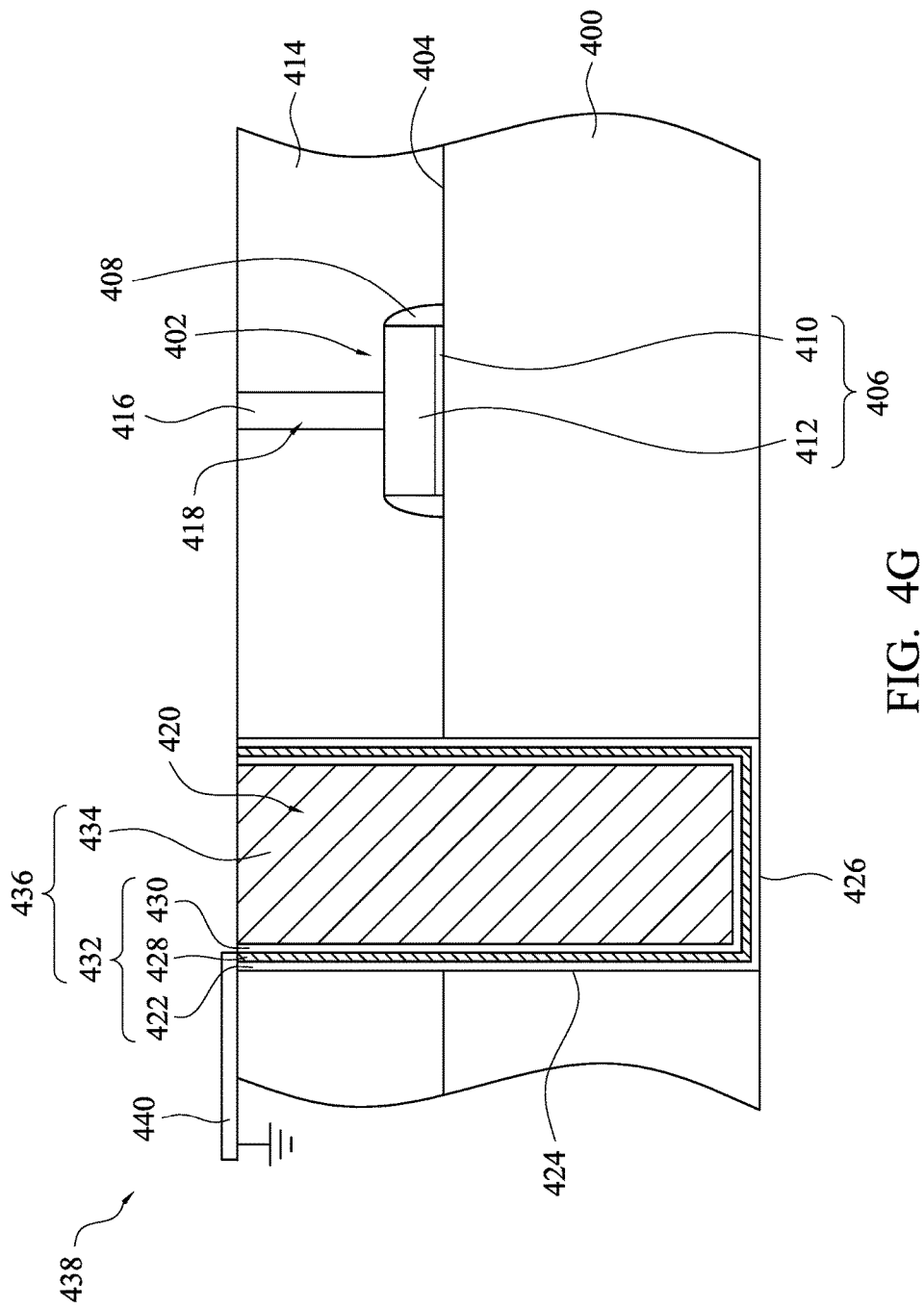

In some examples, as shown in FIG. 4G, a grounding layer 440 may be optionally formed to connect the conductive shielding layer 428 of the through substrate via structure 436 to ground. For example, the grounding layer 440 may be formed on the top of the interlayer dielectric layer 414 and a top of the conductive shielding layer 428, in which one end of the grounding layer 440 is connected to the conductive shielding layer 428, and the other end of the grounding layer 440 is connected to the ground, such that the grounding layer 440 connects the conductive shielding layer 428 to the ground. The grounding layer 440 is not connected to the metal layer 434 of the through substrate via structure 436. The grounding layer 440 may be formed from metal. In some exemplary examples, the grounding layer 440 is formed by using a deposition technique or an electrochemical plating technique.

Figure 5:
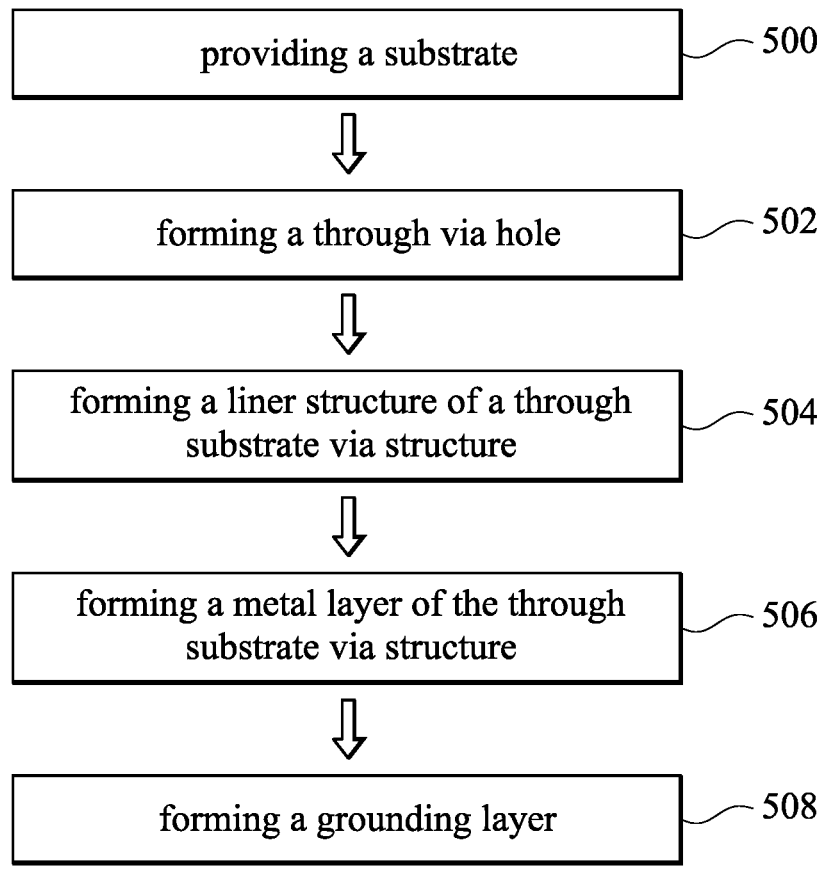
FIG. 5 is a flow chart of a method for manufacturing a semiconductor device in accordance with various embodiments.

Referring to FIG. 5 with FIG. 4A through FIG. 4G, FIG. 5 is a flow chart of a method for manufacturing a semiconductor device in accordance with various embodiments. The method begins at operation 500, where a substrate 400 is provided. The substrate 400 may be a semiconductor substrate, such as a single-crystalline semiconductor substrate or a compound semiconductor substrate. In some exemplary examples, silicon or germanium is used as a material forming the substrate 400.

In some examples, as shown in FIG. 4A, in the operation of providing the substrate 400, at least one device 402 may be optionally formed on a surface 404 of the substrate 400. The device 402 may be an active device or a passive device. For example, the device 402 may be formed to include a gate structure 406 and a spacer 408. In the formation of the device 402, a gate dielectric layer 410 is formed on the surface 404 of the substrate 400, a gate electrode 412 is formed on the gate dielectric layer 410, and the spacer 408 is formed on a sidewall of the gate structure 406.

In some examples, in the operation of providing the substrate 400, after the device 402 is completed, an interlayer dielectric layer 414 is optionally formed to cover the device 402 and the surface 404 of the substrate 400. In some exemplary examples, a planarization process may be performed on the interlayer dielectric layer 414 to form the interlayer dielectric layer 414 having a planar top surface. The planarization process may be performed by using a chemical mechanical polishing technique.

In some examples, a contact 416 may be further formed in the interlayer dielectric layer 414. In some exemplary examples, the formation of the contact 416 includes removing a portion of the interlayer dielectric layer 414 to form a contact hole 418 in the interlayer dielectric layer 414, and forming the contact 416 to fill the contact hole 418. For example, the contact hole 418 may be formed by using a photolithography process and an etching process, and the contact 416 may be formed by using a deposition technique or an electrochemical plating technique. The contact hole 418 is formed to expose a portion of the gate electrode 412 of the device 402, such that the contact 416, which fills the contact hole 418, extends from a top of the interlayer dielectric layer 414 to a top of the gate electrode 412 and contacts the portion of the gate electrode 412. Thus, the contact 416 can electrically connect the gate electrode 412 to other devices or interconnection layers.

At operation 502, as shown in FIG. 4B, a through via hole 420 is formed in the substrate 400 and passes through the substrate 400 by using, for example, a photolithography technique and an etching technique. In some exemplary examples, the through via hole 420 is formed in the interlayer dielectric layer 414 and the substrate 400, and the through via hole 420 extends from a top of the interlayer dielectric layer 414 to a bottom of the substrate 400 to pass through the interlayer dielectric layer 414 and the substrate 400. The through via hole 420 may be adjacent to the device 402.

Referring to FIG. 4C through FIG. 4F, at operation 504, a liner structure 432 of a through substrate via structure 436 as shown in FIG. 4F is formed to cover the through via hole 420. In some examples, as shown in FIG. 4F, the through substrate via structure 436 is formed to include a liner structure 432 and a metal layer 434. In some exemplary examples, the liner structure 432 may be formed to include at least two insulation liners and at least one conductive shielding layer disposed between the insulation liners. For example, as shown in FIG. 4E, the liner structure 432 is formed to include a first insulation liner 422, a second insulation liner 430 and a conductive shielding layer 428, and the conductive shielding layer 428 is disposed between the first insulation liner 422 and the second insulation liner 430. In some certain examples, a liner structure may be formed to include conductive shielding layers and insulation liners, in which a number of the insulation liners is greater than a number of the conductive shielding layers by one, and each of the conductive shielding layers is disposed between adjacent two of the insulation liners.

Referring to FIG. 4C and FIG. 4E, in the operation of forming the liner structure 432, the first insulation liner 422 is formed to cover a sidewall 424 and a bottom 426 of the through via hole 420. In some exemplary examples, the first insulation liner 422 conformally covers the sidewall 424 and the bottom 426 of the through via hole 420. The first insulation liner 422 may be formed by using an atomic layer deposition technique or a chemical vapor deposition technique, such as a plasma-enhanced chemical vapor deposition technique. For example, the first insulation liner 422 may be formed from silicon oxide.

As shown in FIG. 4D, in the operation of forming the liner structure 432, the conductive shielding layer 428 is formed on the first insulation liner 422. In some exemplary examples, the conductive shielding layer 428 is formed to conformally cover the sidewall 424 and the bottom 426 of the through via hole 420. The conductive shielding layer 428 may be formed by using a sputtering technique. For example, the conductive shielding layer 428 may be formed from titanium nitride or tantalum nitride.

As shown in FIG. 4E, in the operation of forming the liner structure 432, the second insulation liner 430 is formed on the conductive shielding layer 428 to complete the liner structure 432. In some exemplary examples, the second insulation liner 430 is formed to conformally cover the sidewall 424 and the bottom 426 of the through via hole 420. The second insulation liner 430 may be formed by using an atomic layer deposition technique or a chemical vapor deposition technique, such as a plasma-enhanced chemical vapor deposition technique. For example, the second insulation liner 430 may be formed from silicon oxide.

At operation 506, as shown in FIG. 4F, the metal layer 434 of the through substrate via structure 436 is formed on the liner structure 432 to complete the through substrate via structure 436, so as to substantially a semiconductor device 438. The metal layer 434 is formed to cover the liner structure 432 and to fill the through via hole 420. The metal layer 434 may be formed by using an electrochemical plating technique. For example, the metal layer 434 may be formed from copper. In some exemplary examples, the through via hole 420 passes through the interlayer dielectric layer 414 and the substrate 400, so that the through substrate via structure 436 filling the through via hole 420 passes through the interlayer dielectric layer 414 and the substrate 400.

In some examples, as shown in FIG. 4G, an operation 508 is optionally performed, where a grounding layer 440 is formed to connect the conductive shielding layer 428 of the through substrate via structure 436 to ground. For example, the grounding layer 440 may be formed on the top of the interlayer dielectric layer 414 and a top of the conductive shielding layer 428, in which one end of the grounding layer 440 is connected to the conductive shielding layer 428, and the other end of the grounding layer 440 is connected to the ground, such that the grounding layer 440 connects the conductive shielding layer 428 to the ground. The grounding layer 440 is not connected to the metal layer 434. The grounding layer 440 may be formed from metal. In some exemplary examples, the grounding layer 440 is formed by using a deposition technique or an electrochemical plating technique.

In accordance with an embodiment, the present disclosure discloses a semiconductor device. The semiconductor device includes a substrate and a through substrate via structure. The substrate has a through via hole. The through substrate via structure is disposed in the through via hole. The through substrate via structure disposed in the through via hole includes a liner structure and a metal layer. The liner structure includes at least two insulation liners and at least one conductive shielding layer disposed between the insulation liners, in which the insulation liners and the at least one conductive shielding layer conformally cover a sidewall and a bottom of the through via hole. The metal layer covers the liner structure and fills the through via hole.

In accordance with another embodiment, the present disclosure discloses a semiconductor device. The semiconductor device includes a substrate, a through substrate via structure and a grounding layer. The substrate has a through via hole. The through substrate via structure includes a liner structure and a metal layer. The liner structure includes at least two insulation liners and at least one conductive shielding layer disposed between the insulation liners, in which the insulation liners and the at least one conductive shielding layer conformally cover a sidewall and a bottom of the through via hole. The metal layer covers the liner structure and fills the through via hole. The grounding layer connects the at least one conductive shielding layer to ground.

In accordance with yet another embodiment, the present disclosure discloses a method for manufacturing a semiconductor device. In this method, a substrate with a through via hole is provided. A through substrate via structure is formed in the through via hole. Forming the through substrate via structure includes forming a liner structure and forming a metal layer. The liner structure is formed to include at least two insulation liners and at least one conductive shielding layer disposed between the insulation liners, and the insulation liners and the at least one conductive shielding layer are formed to conformally cover a sidewall and a bottom of the through via hole. The metal layer is formed to cover the liner structure and to fill the through via hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate, wherein the substrate has a through via hole;
a through substrate via structure disposed in the through via hole and comprising:
a liner structure comprising at least two insulation liners and at least one conductive shielding layer disposed between the insulation liners, wherein the insulation liners and the at least one conductive shielding layer conformally cover a sidewall and a bottom of the through via hole; and
a metal layer covering the liner structure and filling the through via hole; and
a grounding layer connecting the at least one conductive shielding layer to ground.

2. The semiconductor device of claim 1, wherein the insulation liners are formed from silicon oxide.

3. The semiconductor device of claim 1, wherein the at least one conductive shielding layer comprises a plurality of conductive shielding layers, a number of the insulation liners is greater than a number of the conductive shielding layers by one, and each of the conductive shielding layer is disposed between adjacent two of the insulation liners.

4. The semiconductor device of claim 1, further comprising at least one device disposed on a surface of the substrate and adjacent to the through substrate via structure.

5. The semiconductor device of claim 4, further comprising an interlayer dielectric layer disposed on the surface of the substrate and covering the at least one device, the through via hole passing through the interlayer dielectric layer and the substrate.

6. The semiconductor device of claim 1, wherein the at least one conductive shielding layer is separated from the metal layer, and the at least one conductive shielding layer is formed from titanium nitride or tantalum nitride.

7. The semiconductor device of claim 5, wherein the grounding layer extends on the at least one conductive shielding layer, one of the insulation liners which is located between the conductive shielding layer and the interlayer dielectric layer, and a portion of the interlayer dielectric layer without passing through the metal layer.

8. A semiconductor device, comprising:
a substrate, wherein the substrate has a through via hole;
a through substrate via structure, comprising:
a liner structure comprising at least two insulation liners and at least one conductive shielding layer disposed between the insulation liners, wherein the insulation liners and the at least one conductive shielding layer conformally cover a sidewall and a bottom of the through via hole, and the at least one conductive shielding layer is formed from titanium nitride or tantalum nitride; and
a metal layer covering the liner structure and filling the through via hole; and
a grounding layer connecting the at least one conductive shielding layer to ground.

9. The semiconductor device of claim 8, wherein the insulation liners are formed from silicon oxide.

10. The semiconductor device of claim 8, wherein the at least one conductive shielding layer comprises a plurality of conductive shielding layers, and a number of the insulation liners is greater than a number of the conductive shielding layers by one, and each of the conductive shielding layers is disposed between adjacent two of the insulation liners.

11. The semiconductor device of claim 8, further comprising at least one device disposed on a surface of the substrate and adjacent to the through substrate via structure.

12. The semiconductor device of claim 11, further comprising an interlayer dielectric layer disposed on the surface of the substrate and covering the at least one device, the through via hole passing through the interlayer dielectric layer and the substrate.

13. The semiconductor device of claim 12, wherein the grounding layer extends on the at least one conductive shielding layer, one of the insulation liners which is located between the conductive shielding layer and the interlayer dielectric layer, and a portion of the interlayer dielectric layer without passing through the metal layer.

14. A method for manufacturing a semiconductor device, the method comprising:
   providing a substrate with a through via hole;
   forming a through substrate via structure in the through via hole, wherein forming the through substrate via structure comprises:
      forming a liner structure, wherein the liner structure is formed to comprise at least two insulation liners and at least one conductive shielding layer disposed between the insulation liners, and the insulation liners and the at least one conductive shielding layer are formed to conformally cover a sidewall and a bottom of the through via hole, and the at least one conductive shielding layer is formed from titanium nitride or tantalum nitride; and
      forming a metal layer covering the liner structure and filling the through via hole; and
   forming a grounding layer to connect the at least one conductive shielding layer to ground.

15. The method of claim 14, wherein the insulation liners are formed from silicon oxide.

16. The method of claim 14, wherein the insulation liners are formed using a chemical vapor deposition technique or an atomic layer deposition technique.

17. The method of claim 14, wherein the at least one conductive shielding layer is formed using a sputtering technique.

18. The method of claim 14, wherein the at least one conductive shielding layer is formed to comprise a plurality of conductive shielding layers, wherein a number of the insulation liners is greater than a number of the conductive shielding layers by one, and each of the conductive shielding layers is disposed between adjacent two of the insulation liners.

19. The method of claim 14, after providing the substrate, the method further comprising:
   forming at least one device disposed on a surface of the substrate; and
   forming an interlayer dielectric layer on the surface of the substrate and covering the at least one device, wherein the through via hole is formed to pass through the interlayer dielectric layer and the substrate.

20. The method of claim 19, wherein the grounding layer is formed to extend from the at least one conductive shielding layer and to pass through one of the insulation liners, which is located between the conductive shielding layer and the interlayer dielectric layer, and a portion of the interlayer dielectric layer without passing through the metal layer.

* * * * *